United States Patent
Mengad et al.

(10) Patent No.: US 10,250,210 B2
(45) Date of Patent: Apr. 2, 2019

(54) CIRCUIT AND METHOD FOR A HIGH COMMON MODE REJECTION AMPLIFIER BY USING A DIGITALLY CONTROLLED GAIN TRIM CIRCUIT

(71) Applicant: Dialog Semiconductor (UK) Limited, London (GB)

(72) Inventors: Zakaria Mengad, Edinburgh (GB); Steven Collins, Dalkeith (GB); Vladislav Vasilev, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/201,941

(22) Filed: Jul. 5, 2016

(65) Prior Publication Data

US 2018/0097490 A1   Apr. 5, 2018

(51) Int. Cl.
| | |
|---|---|
| *H03F 3/45* | (2006.01) |
| *H03G 1/00* | (2006.01) |
| *H03F 3/387* | (2006.01) |

(52) U.S. Cl.
CPC ........... *H03G 1/0088* (2013.01); *H03F 3/387* (2013.01); *H03F 3/45475* (2013.01); *H03F 3/45928* (2013.01); *H03F 3/45977* (2013.01); *H03F 2200/381* (2013.01); *H03F 2203/45042* (2013.01); *H03F 2203/45044* (2013.01); *H03F 2203/45074* (2013.01); *H03F 2203/45206* (2013.01); *H03F 2203/45528* (2013.01); *H03F 2203/45534* (2013.01); *H03F 2203/45591* (2013.01)

(58) Field of Classification Search
CPC .............. H03G 1/0088; H03F 3/45977; H03F 2203/45042; H03F 2200/381; H03F 2203/45074; H03F 2203/45206; H03F 2203/45044
USPC .............................. 330/254, 258, 51, 144, 86
See application file for complete search history.

(56) References Cited

U.S. PATENT DOCUMENTS

| | | | |
|---|---|---|---|
| 2,954,551 A | | 9/1960 | Doucette et al. |
| 3,036,274 A | * | 5/1962 | Wilson .................... H03F 1/307 330/259 |
| 5,043,675 A | * | 8/1991 | Gilbert |
| 6,222,416 B1 | | 4/2001 | Edeler |
| 6,396,343 B2 | | 5/2002 | Chee |

(Continued)

OTHER PUBLICATIONS

GPTO Office Action, File No. 10 2016 218 529.2, Applicant: Dialog Semiconductor (UK) Limited, dated Jul. 14, 2017, 10 pgs, and English language translation, 5 pgs.

*Primary Examiner* — Khanh V Nguyen
*Assistant Examiner* — Khiem D Nguyen
(74) *Attorney, Agent, or Firm* — Saile Ackerman LLC; Stephen B. Ackerman

(57) ABSTRACT

An amplifier comprising a differential amplifier configured to be provide a comparator function, and a gain trimming circuit is electrically configured to provide gain trimming using a T-network comprising a varistor element. In addition, a method of trimming the gain of a differential amplifier, comprising the steps of a first step, (a) providing the differential amplifier comprising resistors in both of its paths, a second step, (b) providing a varistor in a T-network between both said paths; and lastly, a third step, (c) trimming the gain of the differential amplifier by adjusting the varistor's resistance.

17 Claims, 10 Drawing Sheets

(56) References Cited

U.S. PATENT DOCUMENTS

| | | |
|---|---|---|
| 9,331,573 B2 | 5/2016 | Yanagida |
| 2013/0257536 A1 | 10/2013 | Sharma et al. |
| 2016/0013766 A1 | 1/2016 | Kobayashi |

* cited by examiner

CIRCUIT AND METHOD FOR A HIGH COMMON MODE REJECTION AMPLIFIER BY USING A DIGITALLY CONTROLLED GAIN TRIM CIRCUIT

BACKGROUND

Field

The disclosure relates generally to a differential amplifier and, more particularly, to a gain trim circuit and method for trimming the amplifier's gain.

Description of the Related Art

One of the main methods of achieving a high input common mode rejection ratio (CMRR) in differential amplifiers is to use a chopper circuit to cancel out gain and offset caused by mismatches in the amplifier gain network. The input stage of the amplifier can also be chopped to minimise offset.

FIG. 1 illustrates an example of a prior art amplifier known to the inventor. The differential amplifier 100 has two inputs Vinp 110A and Vinn 110B and output Voutn 120A and Voutp 120B of amplifier 130. In series with the input signals are chopper 140, series resistors 150A and 150B, and a second chopper 160. In the network, feedback resistor 180A and 180B, chopper 170 and 190, and capacitors 195A and 195B exist between the output signals and the input signals. The input stage of the amplifier can also be chopped to minimize offset. However, in some applications the input or output voltages (either direct current (d.c.) or dynamically) of the gain network could be greater than the device gate-to-source voltage, Vgs, and drain-to-source, Vds, ratings making it difficult to implement the input or output chopper. In other cases, a chopper network may not be practical such as the control loop of a class D amplifier. Additionally, choppers could be undesirable in circuits where the inter-modulation is a concern or there is the drive to be very low power.

An amplifier circuit and method of fabrication that satisfies that does not introduce a chopper is desired.

U.S. Pat. No. 6,396,343 to Chee describes a front stage differential amplifier and a common mode rejection circuit employing a twin-T network where the T-network is formed using resistors and capacitor elements. Additionally, there is a CMRR circuit with a variable resistor.

U.S. Pat. No. 6,222,416 to Edeler shows an amplifier with continuous signal routing without branching and crossovers. Additionally, feedback resistors, and a joint resistor for adjusting the differential amplification are also shown.

U.S. Pat. No. 9,331,573 to Yamagida describes a control circuit for controlling a switching transistor of a switching regulator includes a hysteresis comparator circuit comparing a feedback voltage according to an output signal of the switching regulator with a reference voltage and a threshold voltage.

U. S. Patent Application 2016/0013766 to Kobayashi et al. shows an amplifier with a bias feedback network and resistive network.

U.S. Pat. No. 2,954,551 to Doucette et al describes a D/A converter with current responsive summing element, a plurality of field effect varistors, and a plurality of enabling means.

In these prior art embodiments, solutions shown improve the amplifier characteristics utilized various alternative solutions.

SUMMARY

It is desirable to provide an amplifier with high input common mode rejection by accurately matching the gain of both paths of the differential amplifier using a gain trimming network instead of a chopper.

It is desirable to provide an amplifier with high input common mode rejection and wide band amplification by allowing the effects of a resistor mismatch be reduced when chopping is impractical or undesirable.

It is desirable to provide an amplifier with high input common mode rejection by allowing the use of resistors with a larger mismatch leading to area savings compared to untrimmed network design to achieve the same specification.

It is desirable to provide an amplifier for applications where chopping is not feasible and continuous time circuit is required.

It is desirable to provide an amplifier where the circuit application is suitable for both Class D amplifier control feedback and current sense application where high common mode rejections are required with optimal area use.

In summary, an amplifier comprising a differential amplifier with high common mode rejection, comprising resistors in both paths of said differential amplifier; and a varistor in a T-network between said both paths, to provide gain trimming.

In addition, a method of trimming the gain of a differential amplifier, comprising the steps of a first step, (a) providing the differential amplifier comprising resistors in both of its paths, a second step, (b) providing a varistor in a T-network between both said paths; and lastly, a third step, (c) trimming the gain of the differential amplifier by adjusting the varistor's resistance.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
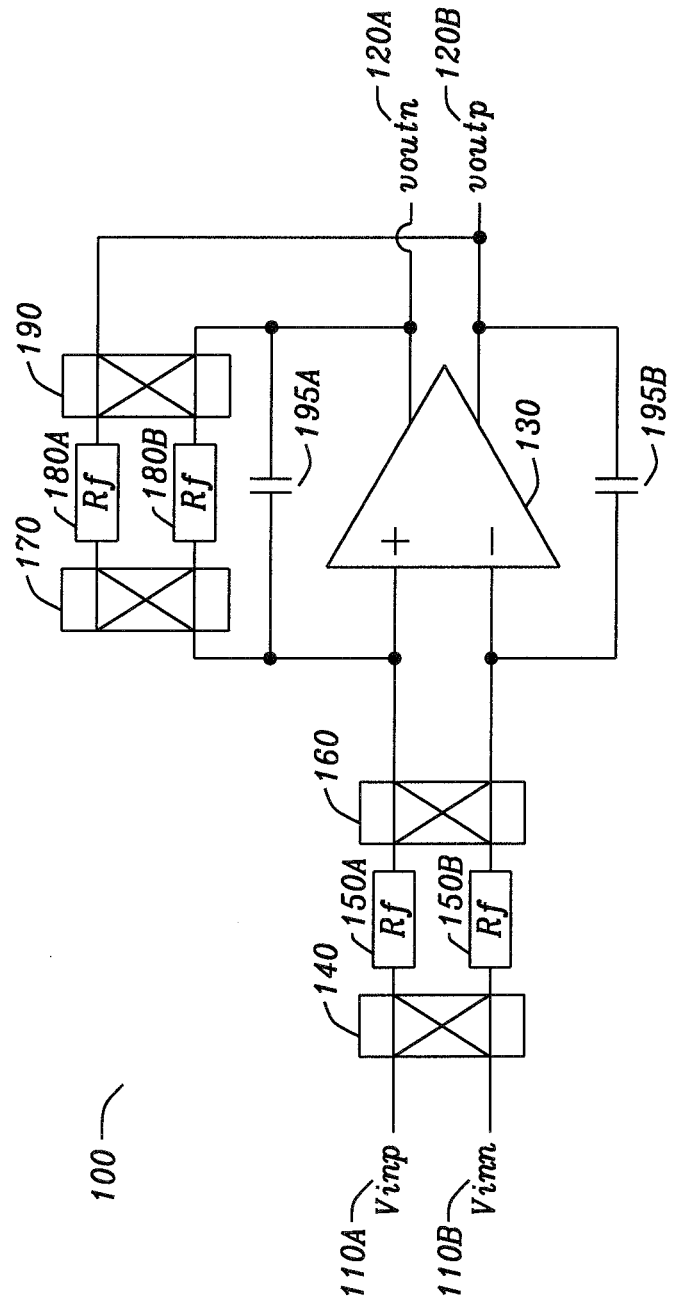
FIG. 1 is a prior art amplifier known to the inventors.
Figure 2:
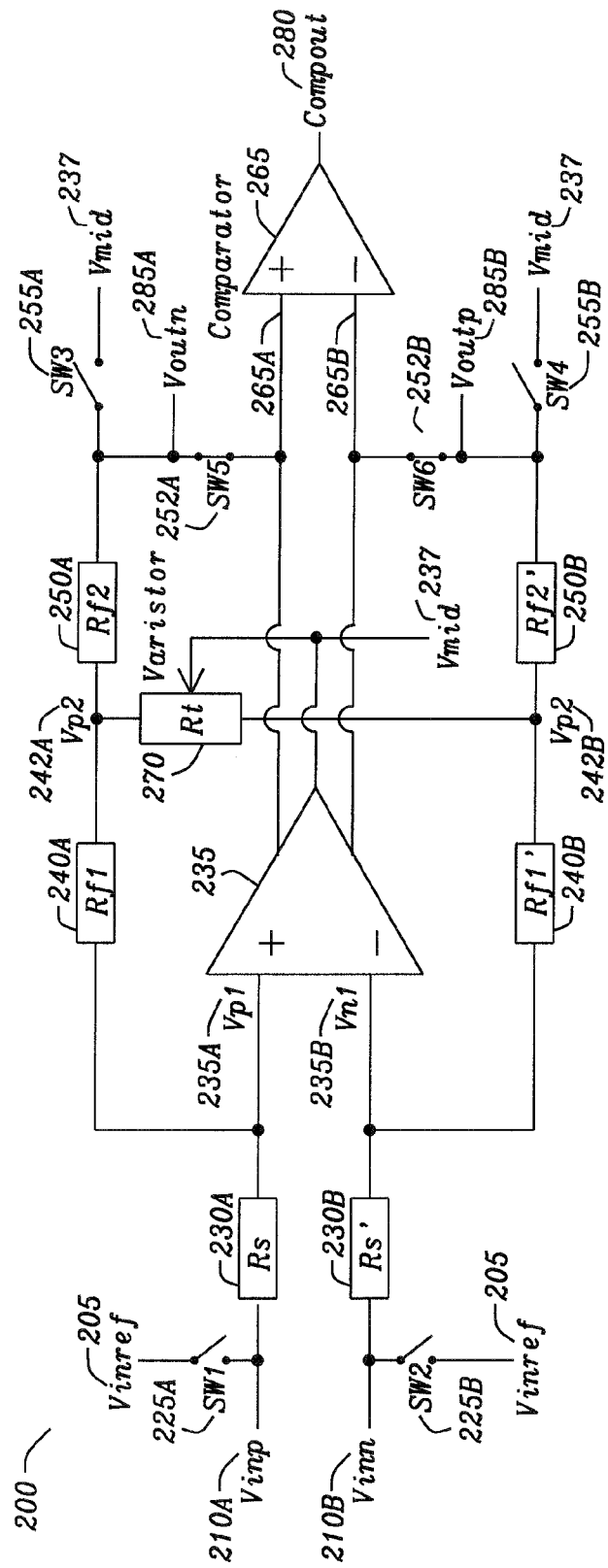
FIG. 2 is an amplifier circuit in accordance with a first embodiment of the disclosure.

FIG. 2 is an amplifier circuit in accordance with a first embodiment of the disclosure. The purpose of the invention is to achieve a high input common mode rejection (which could be in the order of 120 dB or greater) by matching the gain of both sides of a differential amplifier as depicted in FIG. 2. FIG. 2 show a first realization of the amplifier and its gain trimming circuit, depicted with the switches in normal operation mode. FIG. 2 is an embodiment of the circuit 200 where the correction is performed by trimming the feedback path. FIG. 1 is an amplifier with gain trim network where the differential low offset amplifier is used as a comparator, and a simple comparator is then used to convert its output to a digital bit for gain trimming. The current switch positions are normal amplifier operation. If all switches are toggled, the circuit is in gain trim mode.

The inputs of the differential amplifier are Vinp 210A and Vinn 210B. To perform gain trimming the switches SW1 225A and SW2 225B are toggled, causing following: (a) the inputs of the differential amplifier gain network to be tied to Vinref 205. The inputs have a series resistor Rs 230A and Rs' 230B. The differential amplifier 235 have input signals Vp1 235A and Vn 235B. (b) the outputs of the differential amplifier gain network 235 are be tied to Vmid 237 (typically the output common mode voltage of the differential amplifier, this is not a fixed rule though other voltage levels could also be chosen if required), and lastly, (c) the differential amplifier output to be disconnected from the gain network. Note that Vinref 205 and Vmid 237 should ideally be chosen to give the greatest possible voltage across the gain network to ensure maximum accuracy. A varistor 270 is connected to feedback loop formed with resistor network Rf1 240A, and Rf1' 240B. An additional resistor Rf2 250A is coupled to switch SW3 255A, and switch SW5 252A coupled to comparator 265 input signal 265A. An additional resistor Rf2' 250B is coupled to switch SW4 255B, and switch SW6 252B coupled to comparator 265 input signal 265B. Switch SW3 255A and switch 255B are coupled to signal 237. Switch SW5 is coupled to Voutn 285A, and switch SW6 is coupled to Voutp 285B. The output of the comparator 265 is Compout 280.

If all the resistors match perfectly and the varistor center tap is selected (i.e. Vp2 242A is connected to Vmid 237 by a resistance of Rt/2) then Vp1 235A would equal Vn1 235B and the comparator 235 would be at its switching point indicating the matched gains. If there is any mismatch in the network, the comparator output will flip. So to trim the circuit gain the varistor 270 tap point can be swept incrementally through its setting to find the comparator switching point, which is the required trim setting for matched gain and hence high common mode rejection ratio (CMRR). This trimming can also be done via a binary search (as will be shown in FIG. 5), where a high comparator output indicates that the trim setting is too large. The trace shows vp1 and vn1 converging as the gains become matched.

Figure 3:
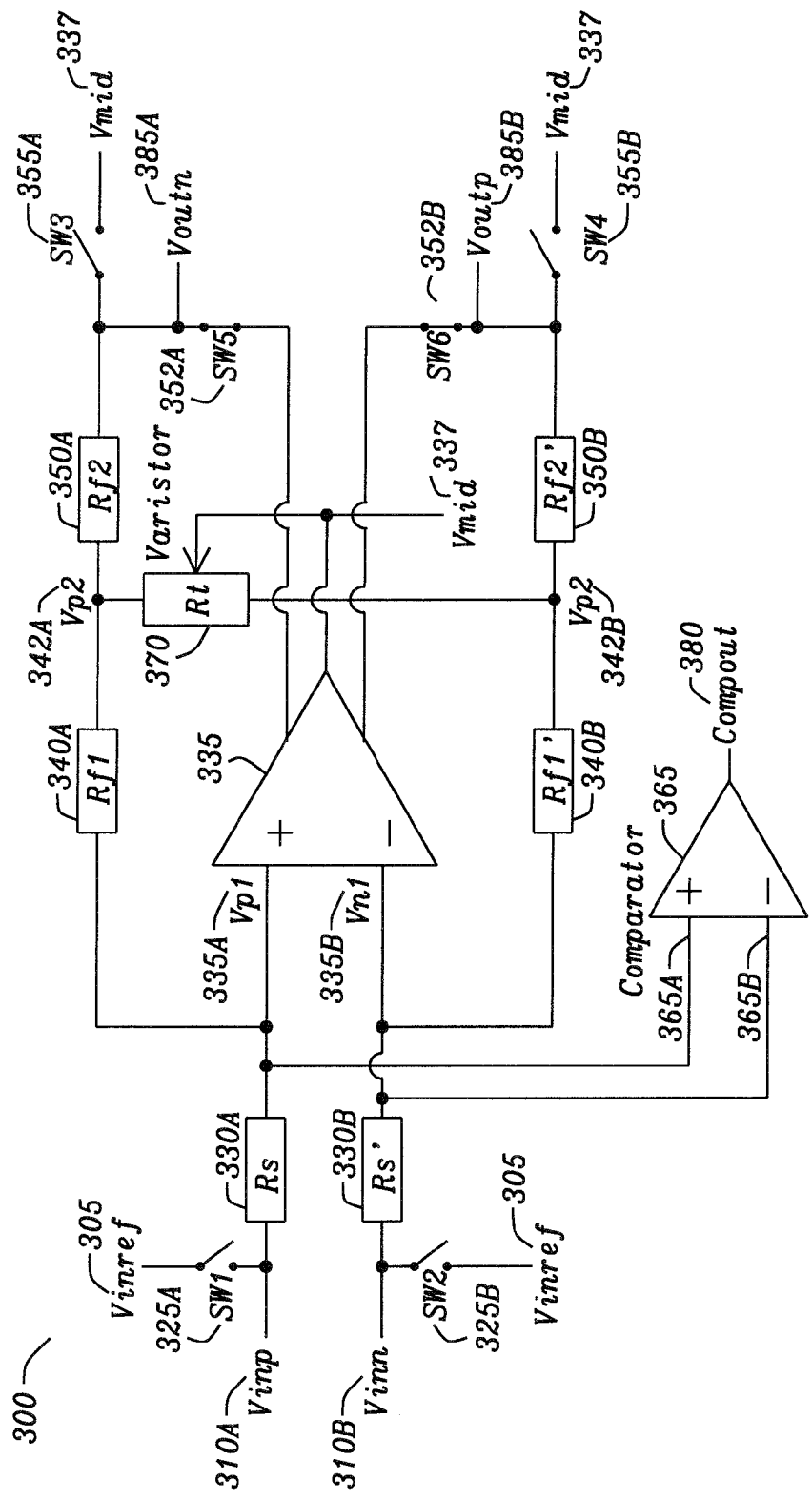
FIG. 3 is an amplifier circuit in accordance with a second embodiment of the disclosure.

The gains of both sides of the amplifier are given by Equation 1 and Equation 2, for circuits FIG. 1 (as well as FIG. 3). Ideally infinite common mode rejection will occur when $A_{diff1}=A_{diff2}$ assuming no parasitics.

$$A_{diff1} = \frac{R_{f1}R_{f2}}{R_s R_T \text{trim}} + \frac{R_{f1} + R_{f2}}{R_s} \quad \text{Equation 1}$$

$$A_{diff2} = \frac{R'_{f1}R'_{f2}}{R'_s R_T (1-\text{trim})} + \frac{R'_{f1} + R'_{f2}}{R'_s} \quad \text{Equation 2}$$

Therefore using Equation 1 and Equation 2 the following components of a polynomial (as will be shown in Equation 4, Equation 5 and Equation 6) can be obtained to provide a relationship between input impedance mismatch ($mm_s$) and feedback impedance mismatch ($mm_f$), where x is the gain trim setting, 0.5 being the setting when there is no mismatch. The standard polynomial root calculation (Equation 7) can then be used calculate the trim required for a particular level of mismatch. The relationship between mismatch and trim value is not linear and the level of none linearity increases for smaller choices of $R_T$ and larger choices of $R_f$. As a result, the varistor taps could be setup to be non-linear to linearize the mismatch to correction setting and hence reduce the number of needed taps.

$$A = \frac{R_{f1}}{R_{f2}}[(1+mm_s)(1-mm_f)-1] = \frac{R_{f2}R_T(1-2x)}{R_{f2}^2 + R_{f2}R_T + x(x-1)R_T^2} \quad \text{Equation 3}$$

$$a = -AR_T^2 \quad \text{Equation 4}$$

$$b = AR_T^2 + 2R_{f2}R_T \quad \text{Equation 5}$$

$$c = A(R_{f2}^2 + R_{f2}R_T) - R_T R_{f2} \quad \text{Equation 6}$$

$$\text{Trim} x = \frac{-b + \sqrt{b^2 - 4ac}}{2a} \quad \text{Equation 7}$$

Figure 7:
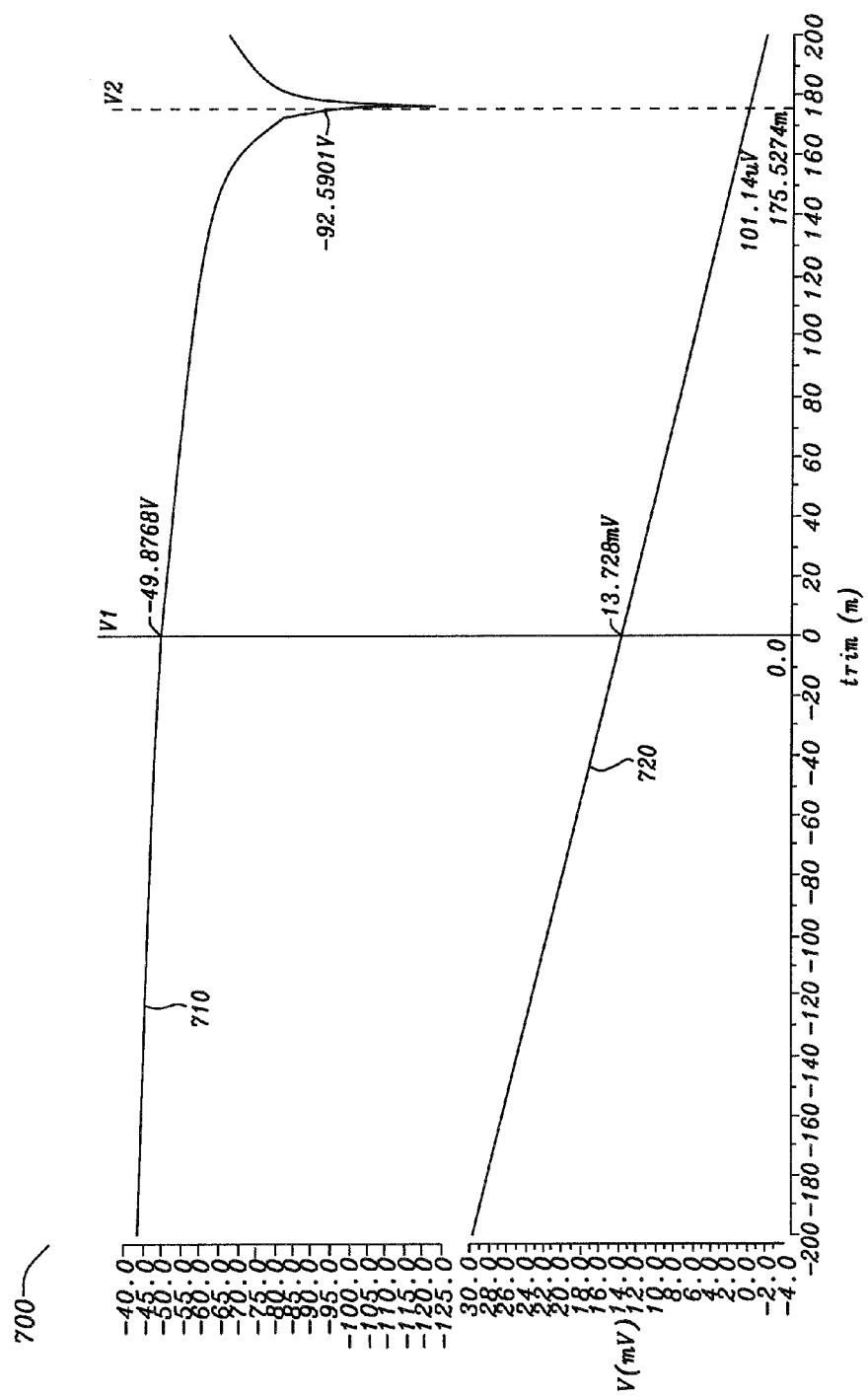
FIG. 7 illustrates the common mode rejection and output offset voltage in accordance with the embodiments of the disclosure.
Figure 8:
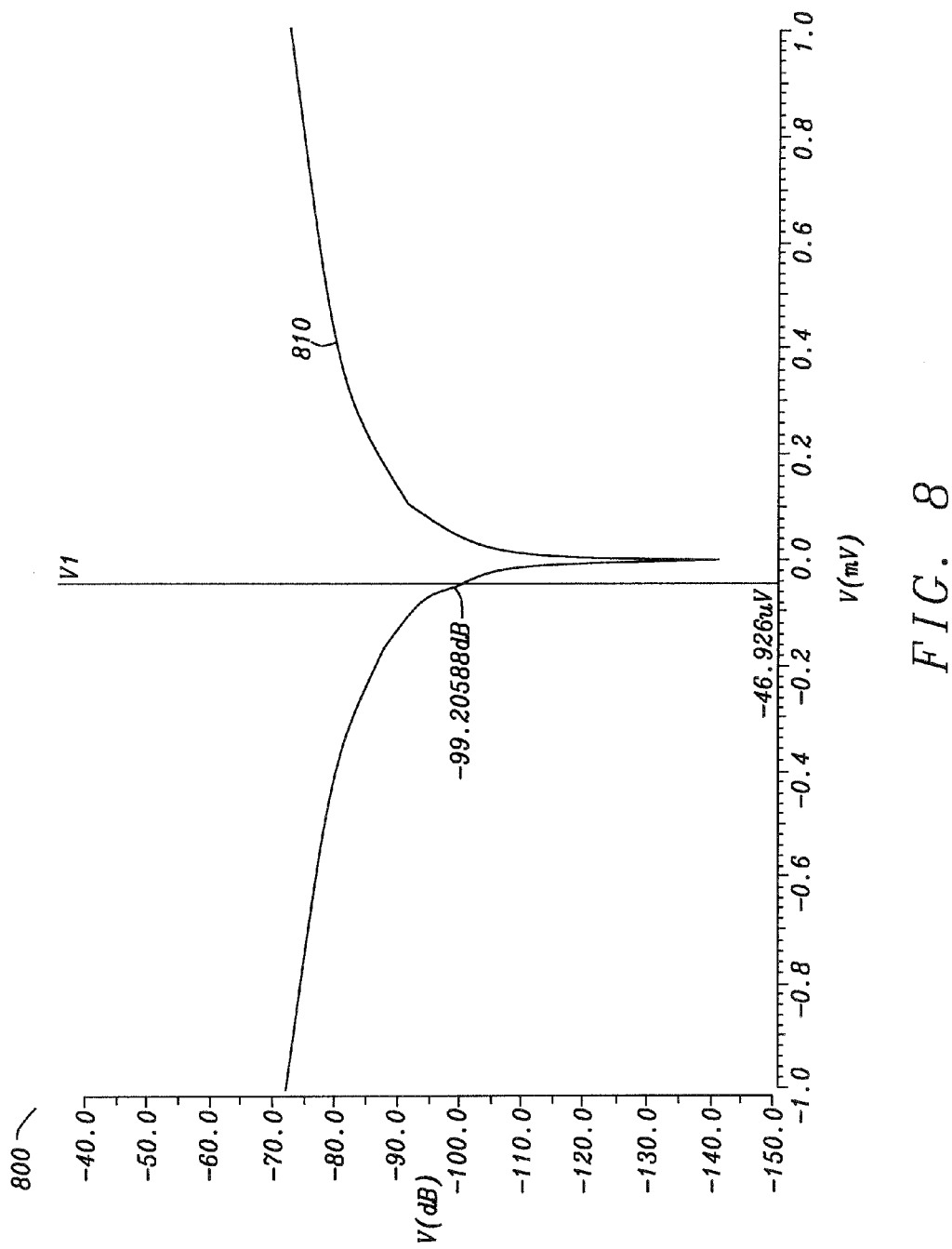
FIG. 8 illustrates the common mode rejection versus output offset voltage in accordance with the embodiments of the disclosure.

An example of the offset trim accuracy needed to provide a particular common mode rejection for a gain network with a 0.1% resistor mismatch and a gain of 2.75 (as will be shown in is shown in FIG. 7 and FIG. 8).

FIG. 3 is an amplifier circuit in accordance with a second embodiment of the disclosure. FIG. 3 show a second realization of the amplifier and its gain trimming circuit, depicted with the switches in normal operation mode. FIG. 3 is an embodiment of the circuit where the correction is performed by trimming the feedback path. FIG. 3 is an amplifier with gain trim network separately where the differential amplifier is not used in the trim process. Current switch positions are normal amplifier operation. If all switches are toggled the circuit is in gain trim mode. The circuit 300 has inputs of the differential amplifier 335 are Vinp 310A and Vinn 310B. To perform gain trimming the switches SW1 325A and SW2 325B are toggled, causing following: (a) the inputs of the differential amplifier gain network to be tied to Vinref 305. The inputs have a series resistor Rs 330A and Rs' 330B. The differential amplifier 335 have input signals Vp1 335A and Vn 335B. (b) the outputs of the differential amplifier gain network 335 are be tied to Vmid 337 (typically the output common mode voltage of the differential amplifier, this is not a fixed rule though other voltage levels could also be chosen if required), and lastly, (c) the differential amplifier output to be disconnected from the gain network. Note that Vinref 305 and Vmid 337 should ideally be chosen to give the greatest possible voltage across the gain network to ensure maximum accuracy. A varistor 370 is connected to feedback loop formed with resistor network Rf1 340A, and Rf1' 340B. An additional resistor Rf2 350A is coupled to switch SW3 355A, and switch SW5 352A. An additional resistor Rf2' 250B is coupled to switch SW4 355B, and switch SW6 352B. Switch SW3 355A and switch 355B are coupled to signal Vmid 337. Switch SW5 is coupled to Voutn 385A, and switch SW6 is coupled to Voutp 385B. In this implementation, the comparator 365 are coupled at the input between resistor 330A and resistor 330B and the differential amplifier 335. The output of the comparator 365 is Compout 380.

Figure 4:
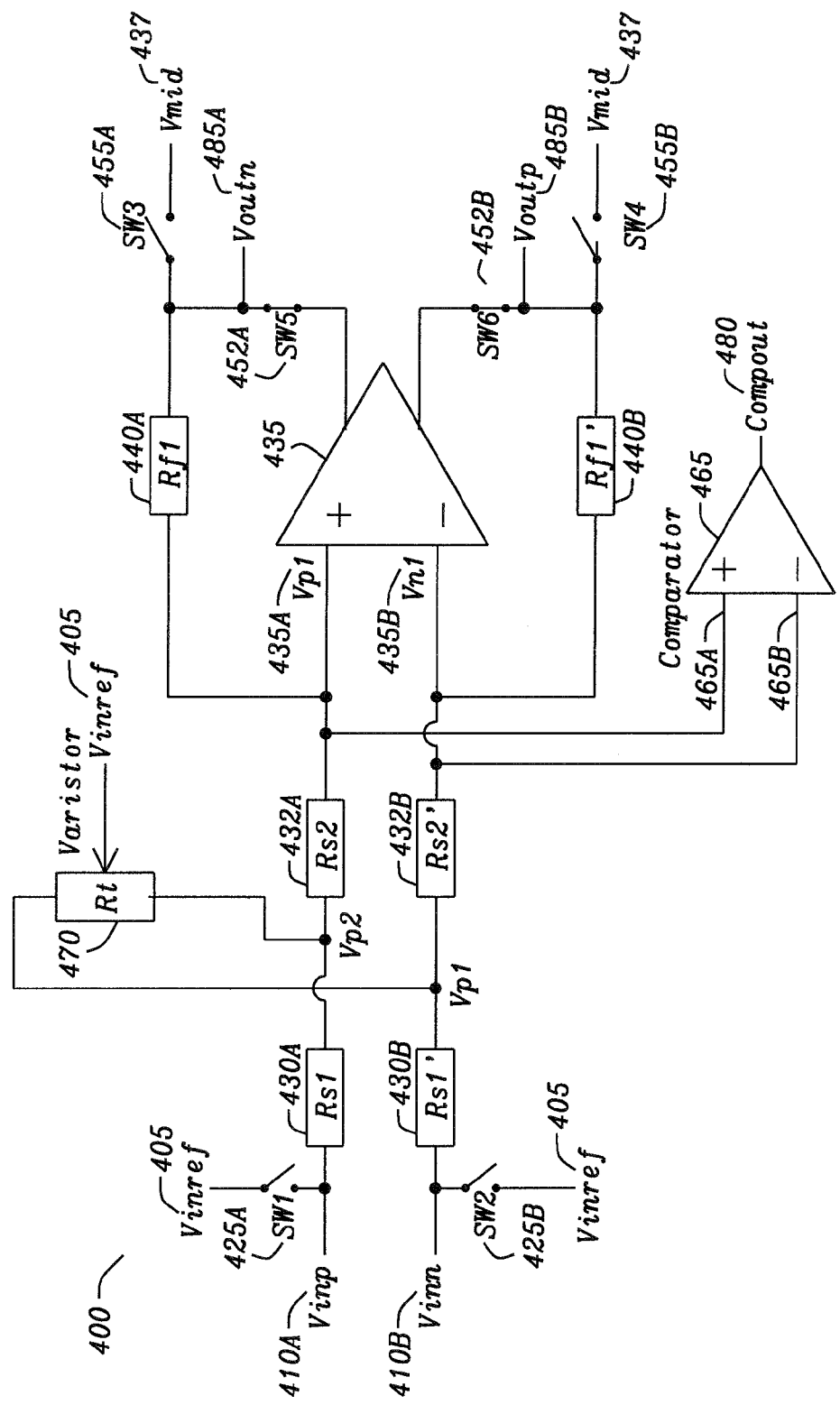
FIG. 4 is an amplifier circuit in accordance with a third embodiment of the disclosure.

FIG. 4 is an amplifier circuit in accordance with a third embodiment of the disclosure. FIG. 4 shows a circuit 400 where the trim is performed in the input resistance path. FIG. 2 is an alternative circuit realisation, where gain trim is performed by a T-network in the input resistors to the amplifier. Current switch positions are normal amplifier operation. If all switches are toggled the circuit is in gain trim mode. To perform gain trimming the switches SW1 425A and SW2 425B are toggled, causing following: (a) the inputs of the differential amplifier gain network to be tied to Vinref 405. The inputs have a series resistor Rs1 430A and Rs1' 430B; these are followed by Rs2 432A and Rs2' 432B. The differential amplifier 435 have input signals Vp1 435A and Vn 435B. (b) the outputs of the differential amplifier network 435 are be tied to switch SW5 452A and switch SW6 452B. A feedback resistor Rf 440A is coupled to Vp1 435A and a second feedback resistor Rf' 435B is coupled to signal Vn1 435B. The resistor Rf 440A is coupled to switch SW3 455A, and switch SW5 452A. the Rf' 440B is coupled to switch SW4 455B, and switch SW6 452B. Switch SW3 455A and switch 455B are coupled to signal Vmid 437. Switch SW5 452A is coupled to Voutn 485A, and switch SW6 452B is coupled to Voutp 485B. In this implementation, the comparator 465 are coupled at the input between resistor 432A and resistor 432B and the differential amplifier 435. The output of the comparator 465 is Compout 480. The varistor 470 is coupled to between resistor Rs1 430A and resistor Rs2 432A, as well as coupled between resistor Rs1' 430B and Rs2' 432B forming a T-network.

Figure 5:
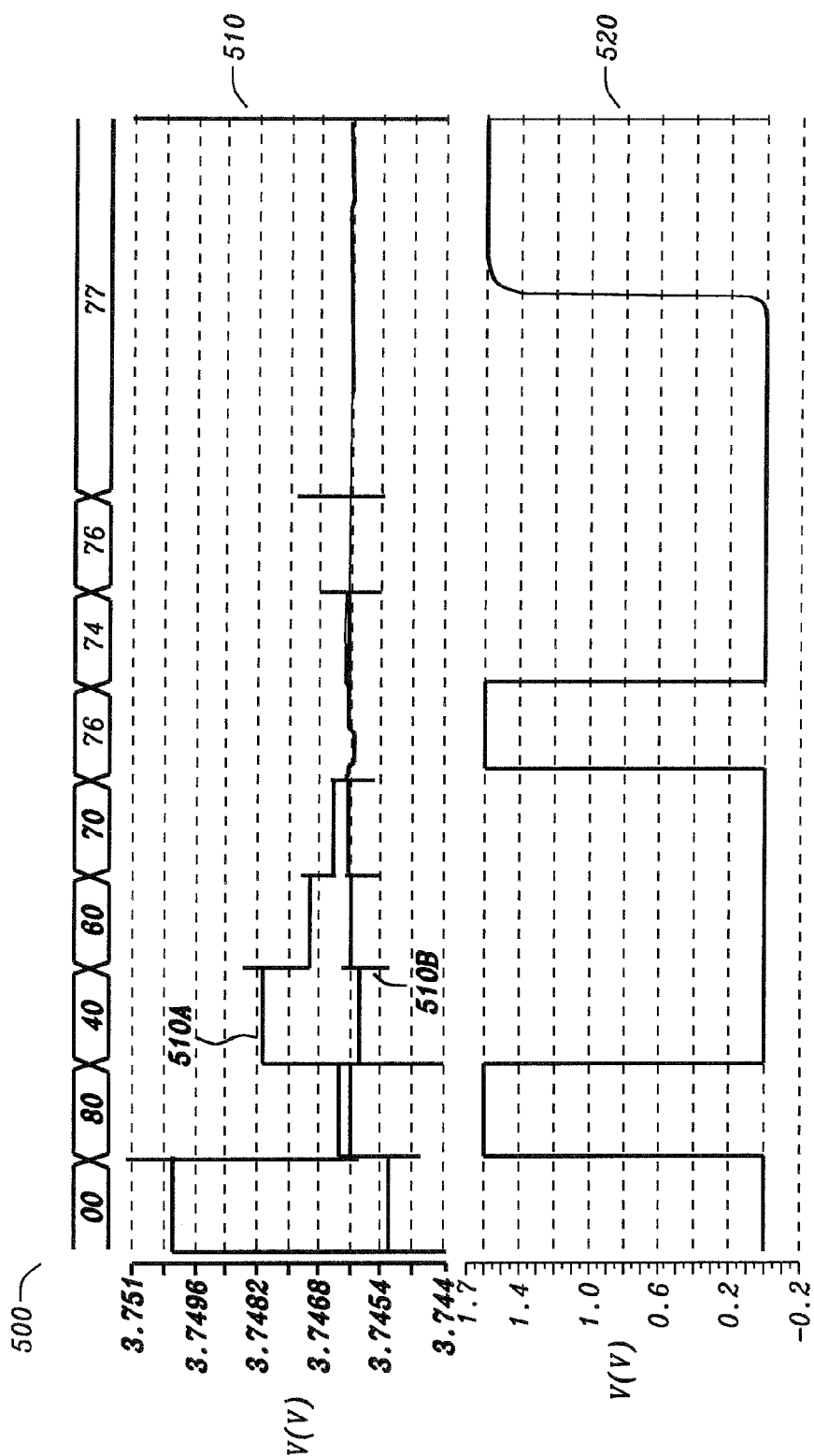
FIG. 5 illustrates a gain trimming waveform in accordance with the embodiments of the disclosure.

FIG. 5 illustrates a gain trimming waveform in accordance with the embodiments of the disclosure. FIG. 5 shows waveforms 500 of gain trimming waveforms for a binary search trim technique in plots 510 and 520. It shows the signals Vp1 510A and signal Vn1 510B being trimmed until they become equal. The comparator output 520 is also shown. The varistor tap selection (trim code) 505 is also shown. When a code of $0_{16}$ is set the difference between 510A and 510E is large and comparator ouput is low. Once the code is set to mid range ($80_{16}$) the comparator flips high dues to 510A and 510B crossing indicating the code over corrects therefore on the next code bit 7 is reset and bit 6 set. If the comparator is low the bit remains set as show when the code becomes $60_{16}$ and the difference between 510A and 510B continues to reduce until the final code $77_{16}$ in this example results in 510A & 510B converging. If all the resistors match perfectly and the varistor center tap is selected (i.e. Vp2 is connected to Vmid by a resistance of Rt/2) then signal Vp1 510A would equal signal Vn1 510B and the comparator would be at its switching point indicating the matched gains. If there is any mismatch in the network, the comparator output will flip. So to trim the circuit gain the varistor tap point can be swept incrementally through its setting to find the comparator switching point, which is the required trim setting for matched gain and hence high common mode rejection ratio (CMRR). This trimming can also be done via a binary search as shown in FIG. 5, where a high comparator output indicates that the trim setting is too large. The trace shows signals Vp1 510A and Vn1 510B converging as the gains become matched.

Figure 6:
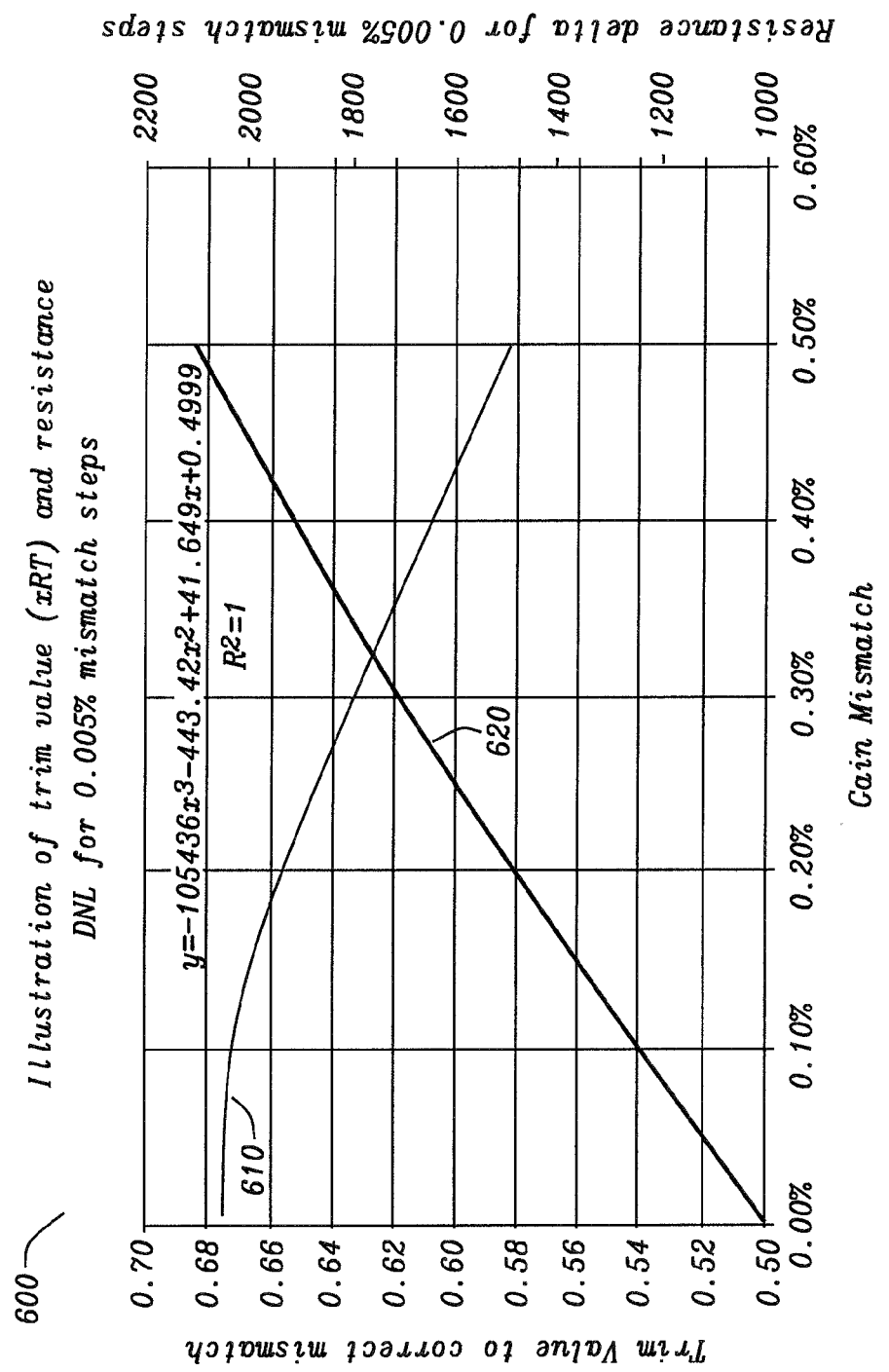
FIG. 6 illustrates the trim value required for mismatch and ΔR in accordance with the embodiments of the disclosure.

FIG. 6 illustrates the trim value required for mismatch and ΔR in accordance with the embodiments of the disclosure. FIG. 6 illustrations 600 shows the trim value required for mismatch correction 620 and the Δ R 610 as the correction moves away from x=0.5 in mismatch steps of 0.005% for Rs and Rf. Rs=293KΩ, Rf1=643KΩ, Rf2=71KΩ and RT=1MΩ.

FIG. 7 illustrates the common mode rejection and output offset voltage in accordance with the embodiments of the disclosure. An example of the offset trim accuracy needed to provide a particular common mode rejection for a gain network with a 0.1% resistor mismatch and a gain of 2.75 It also shows a 42 dB common mode rejection improvement compared to uncorrected, if the input is trimmed to an accuracy of 27 µV. FIG. 7 is common mode rejection 710 and output offset voltage against trim value (0 being ideal trim value) 720 for a circuit with a gain of 2.75 and a resistor mismatch of 0.1%. It shows 13.7 mV offset and a common mode rejection of −49.9 dB when no correction is applied (v1) and −92.5 dB if the trim accuracy is to 100 µV. (Rs=293KΩ, Rf1=643KΩ, Rf2=71KΩ and RT=1MΩ).

FIG. 8 illustration 800 is the common mode rejection 810 versus output offset voltage in accordance with the embodiments of the disclosure. FIG. 8 is the common mode rejection v output offset voltage for a circuit with a gain of 2.75 and a resistor mismatch of 0.1%. It shows an output offset of −99 dB can be achieved with a trim accuracy of 46 µV (12.3 µV offset at the input). (Rs=293KΩ, Rf1=643KΩ, Rf2=71KΩ and RT=1MΩ).

Figure 9:
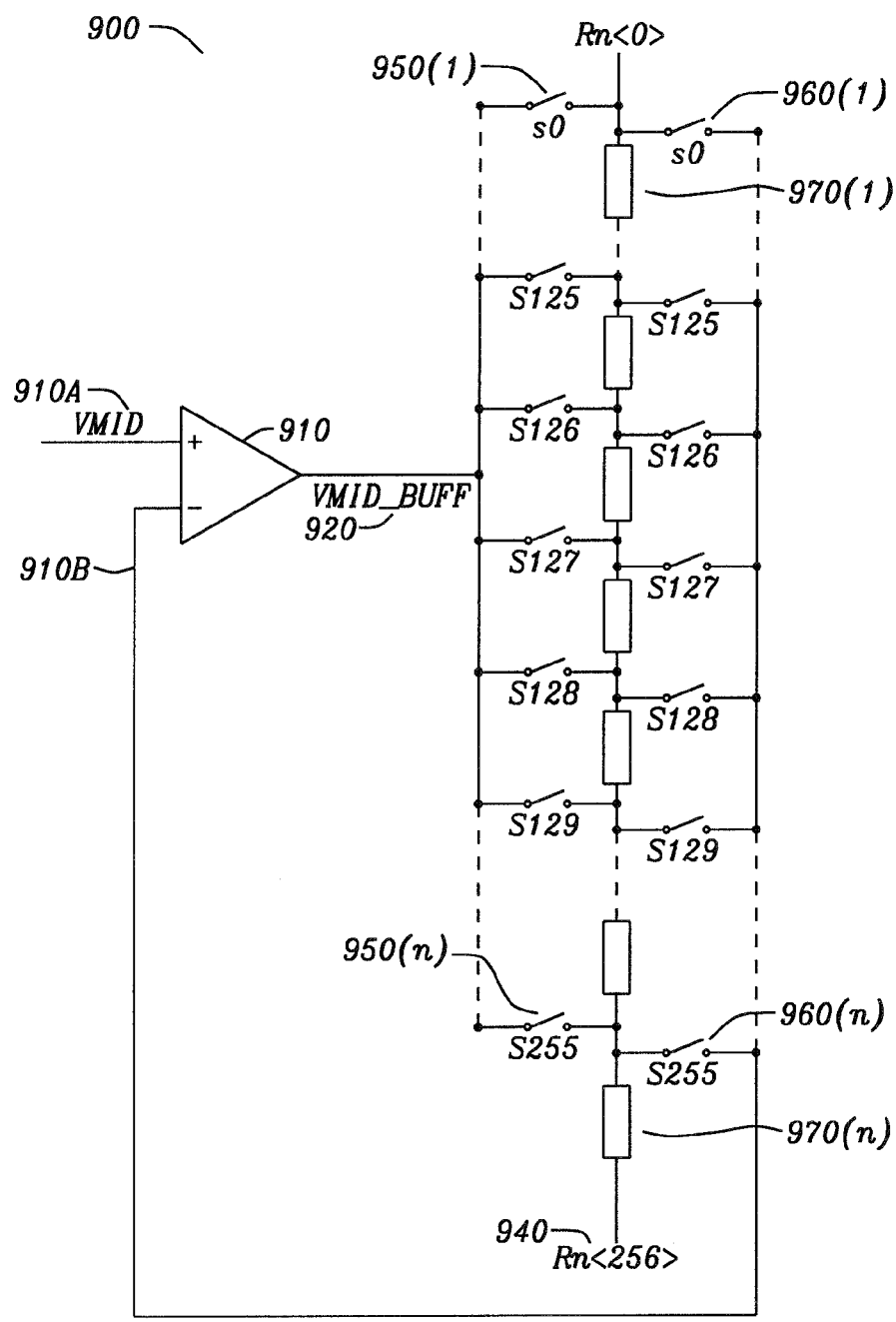
FIG. 9 is an electrical schematic of the varistor block level diagram in accordance with the embodiments of the disclosure.

FIG. 9 is an electrical schematic of the varistor block level diagram 900 in accordance with the embodiments of the disclosure. A realization of the varistor 900 is shown in FIG. 9, where the digitally selected switch pair connects the negative input and output of voltage buffer to achieve a Kelvin connection to drive the selected tap to Vmid. A comparator 910 has two inputs 910A and 910B. The varistor structure has a series of switches 950 (1) to 950 (n) at its input, and 960 (1) to 960 (n) at its output which is coupled to the negative input signal 910B. Resistors 970 (1) to 970 (n) exists in a series configuration with signal 930 and signal 940. Note that the gain and offset of circuit used to compare signal Vpn1 and signal Vpn2 affect the gain matching accuracy and hence directly govern the level of common mode rejection. This means in the case of FIG. 2 the amplifier must have a low DC offset and high gain to allow it to be usable as a comparator (i.e. not chopped). This could be used active by either using a low mis-match design or offset trim circuitry. Note that the amplifier is used to pull the digitally selected tap point to signal Vmid using a second digitally selected switch which acts as a Kelvin sense connection to ensure switch resistance does not affect the varistor tap voltage.

Figure 10:
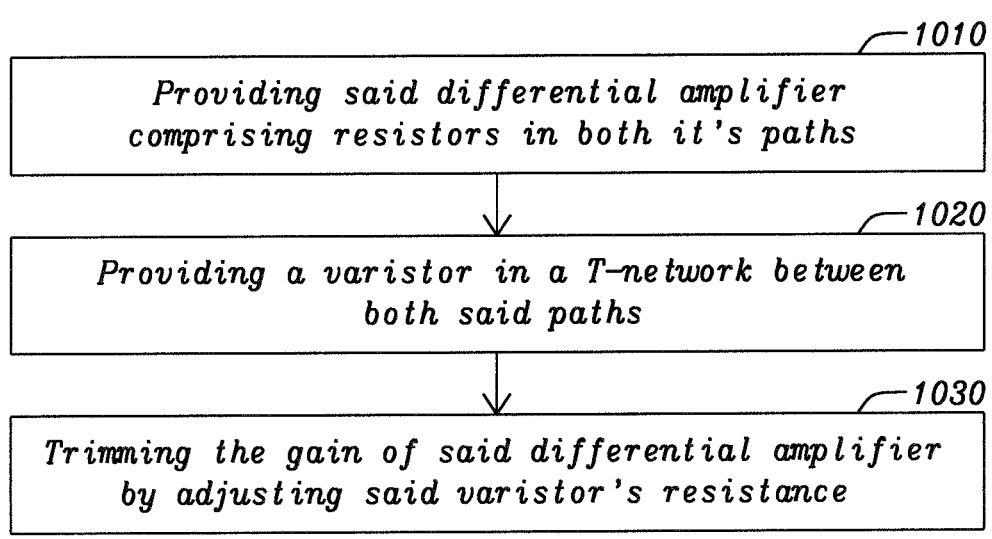
FIG. 10 is a method of operation of the amplifier in accordance with the embodiments of the disclosure.

FIG. 10 is a method of operation of the amplifier in accordance with the embodiments of the disclosure. FIG. 10 shows a method of trimming the gain of a differential amplifier 1000, comprising the steps of a first step 1010, (a) providing said differential amplifier comprising resistors in both of its paths, a second step 1020, (b) providing a varistor in a T-network between both said paths; and lastly, a third step 1030, (c) trimming the gain of said differential amplifier by adjusting said varistor's resistance.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A differential amplifier with high common mode rejection, comprising:
   resistors in both paths of said differential amplifier wherein said differential amplifier comprises a pair of said resistors in each of its feedback paths; and
   a varistor in a T-network between said both said feedback paths, to provide gain trimming; and
   wherein said varistor is connected between each pair of said resistors.

2. The differential amplifier of claim 1, wherein said differential amplifier comprises a pair of said resistors in each of its input paths, wherein said varistor in a T-network is connected between said input paths.

3. The differential amplifier of claim 1 wherein an input switch is connected to each input path of said differential amplifier, before an input resistor, and is configured to connect said input path to an input reference voltage during said gain trimming.

4. The differential amplifier of claim 3, wherein a feedback switch is connected to each feedback path of said differential amplifier, on the output terminals of said differential amplifier, and is configured to connect said feedback path to a voltage Vmid during said gain trimming.

5. The differential amplifier of claim 4, wherein an output switch is connected between each output of said differential amplifier and said output terminal of each feedback path, and is configured to disconnect said differential amplifier outputs during said gain trimming.

6. The differential amplifier of claim 1, further comprising a comparator connected to output terminals of said differential amplifier, wherein said comparator is configured to compares the output signals of said differential amplifier.

7. The differential amplifier of claim 1, further comprising a comparator connected to input terminals of said differential amplifier, wherein said comparator is configured to compare said input terminals of said differential amplifier.

8. A method of trimming gain of a differential amplifier, comprising the steps of:

(a) wherein said a differential amplifier comprises resistors in both of its paths wherein said differential amplifier comprises a pair of said resistors in each of its feedback paths;
   (b) connecting a varistor in a T-network between both said feedback paths, wherein said varistor is connected between each pair of said resistors;
   (c) trimming the gain of said differential amplifier by adjusting resistance of said varistor.

9. The method of trimming gain of the differential amplifier of claim 8, further comprising to provide a relationship between input impedance mismatch ($mm_s$) and feedback impedance mismatch ($mm_f$).

10. The method of trimming gain of the differential amplifier of claim 9, when the gain trim setting, x, is 0.5, there is no mismatch.

11. The method of trimming gain of the differential amplifier of claim 10, where said gain trimming setting, x, is further evaluated from the following system of equations wherein $Adiff_1$ and $Adiff_2$ are gain of the differential amplifier, A is amplification, and a, b, and c are standard polynomial of gain trimming setting x:

$$A_{diff1} = \frac{R_{f1}R_{f2}}{R_s R_T \text{ trim}} + \frac{R_{f1} + R_{f2}}{R_s} \quad \text{Equation 1}$$

$$A_{diff2} = \frac{R'_{f1}R'_{f2}}{R'_s R_T (1 - \text{trim})} + \frac{R'_{f1} + R'_{f2}}{R'_s} \quad \text{Equation 2}$$

$$A = \quad \text{Equation 3}$$
$$\frac{R_{f1}}{R_{f2}}[(1 + mm_s)(1 - mm_f) - 1] = \frac{R_{f2} R_T (1 - 2x)}{R_{f2}^2 + R_{f2}R_T + x(x-1)R_T^2}$$

$$a = -AR_T^2 \quad \text{Equation 4}$$

$$b = AR_T^2 + 2R_{f2}R_T \quad \text{Equation 5}$$

$$c = A(R_{f2}^2 + R_{f2}R_T) - R_T R_{f2} \quad \text{Equation 6}$$

$$\text{Trim } x = \frac{-b + \sqrt{b^2 - 4ac}}{2a}. \quad \text{Equation 7}$$

12. A differential amplifier with high common mode rejection, comprising:
   resistors in both paths of said differential amplifier wherein said differential amplifier comprises a pair of said resistors in each of its input paths; and
   a varistor in a T-network between said both said input paths, to provide gain trimming.

13. The differential amplifier of claim 12, wherein said varistor is connected between each pair of said resistors.

14. The differential amplifier of claim 12, wherein an input switch is connected to each input path of said differential amplifier, before an input resistor, and is configured to connect said input path to an input reference voltage during said gain trimming.

15. The differential amplifier of claim 12, wherein a feedback switch is connected to each feedback path of said differential amplifier, on the output terminal, and is configured to connect said feedback path to a voltage Vmid during said gain trimming.

16. The differential amplifier of claim 12, wherein an output switch is connected between each output of said differential amplifier and said output terminal of each feedback path, and is configured to disconnect said differential amplifier outputs during said gain trimming.

17. The differential amplifier of claim 12, further comprising a comparator connected to inputs terminals of said differential amplifier, wherein said comparator is configured to compare said input terminals of said differential amplifier.

* * * * *